United States Patent
Parris et al.

(10) Patent No.: US 6,788,590 B2
(45) Date of Patent: Sep. 7, 2004

(54) BITLINE REFERENCE VOLTAGE CIRCUIT

(75) Inventors: Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/345,736

(22) Filed: Jan. 16, 2003

(65) Prior Publication Data

US 2004/0141360 A1 Jul. 22, 2004

(51) Int. Cl.[7] .................................................. G11C 16/04
(52) U.S. Cl. .................................... 365/189.09; 365/149
(58) Field of Search ............................ 365/189.09, 205, 365/149, 203, 72

(56) References Cited

U.S. PATENT DOCUMENTS 4,669,065 A    5/1987  Ohsawa
6,002,617 A  * 12/1999  Manning ................ 365/189.09
6,111,803 A    8/2000  Derner et al.

* cited by examiner

Primary Examiner—David Lam
(74) Attorney, Agent, or Firm—Peter J. Meza; William J. Kubida; Hogan & Hartson LLP

(57) ABSTRACT

A bitline reference voltage circuit according to the present invention includes a first transistor having a current path coupled between a first bitline and an intermediate node, and a gate for receiving a first control signal, a second transistor having a current path coupled between a second bitline and the intermediate node, and a gate for receiving a second control signal, a third transistor having current path coupled between the intermediate node and a source of constant voltage, and a gate for receiving a third control signal, and a capacitor coupled between the intermediate node and the source of constant voltage.

20 Claims, 9 Drawing Sheets

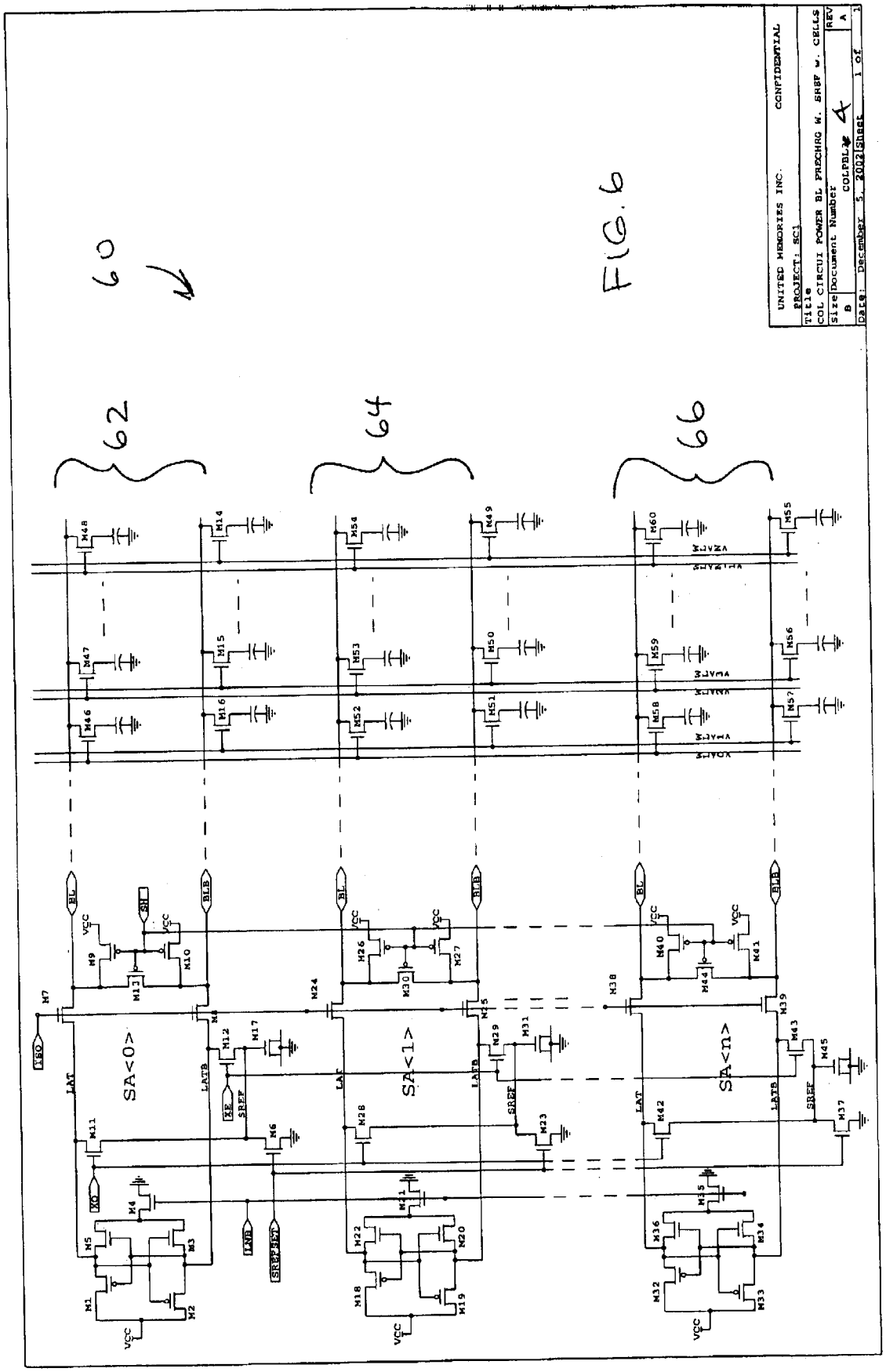

BITLINE REFERENCE VOLTAGE CIRCUIT

BACKGROUND OF THE INVENTION

The present invention relates, in general, to integrated circuit memories. More particularly, the present invention relates to a bitline reference voltage circuit for use in an integrated circuit memory.

For non VCC/2 BL precharged DRAMs, establishing a reliable reference voltage is difficult. A prior art reference voltage circuit 10 is shown in FIG. 1.

Transistor M1 and capacitor C1, as well as transistor M2 and capacitor C2, are extra memory cells placed along BL (bit line) and BLB (bit line bar) and serve as reference cells. Lines XE and XO are extra wordlines referred to as "X even" and "X odd" or "dummy" wordlines. Line XE goes high and transfers a reference voltage to bitline BL when a regular wordline WL (not shown in FIG. 1) accesses a memory cell (not shown in FIG. 1) attached to the inverted bitline BLB. Wordline XO goes high when a regular wordline WL accesses a memory cell attached to bitline BL. After sensing and restoring, a memory cell high level and a memory cell low level divided by two needs to be stored onto both capacitors C1 and C2. This is accomplished by turning on the second dummy wordline during the restore operation, then turning both dummy wordlines off, then activating the SH line to charge share the charge on capacitors C1 and C2 so that the proper reference voltage is achieved.

The problem with this prior art technique is the complicated timing sequence required and the use of the extra transistor M3 with its connections to cell nodes N1 and N2 in each of the reference cells. These nodes N1 and N2 are buried strap connections that are difficult to access. Making contact to these nodes could alter the capacitance on nodes N1 and N2 so that the reference cells would no longer match the regular memory cells without this connection. Modifying nodes N1 and N2 in this way would also undesirably change the leakage current of the reference memory cells.

Another prior art reference circuit uses VCC precharged bitlines wherein charge is bled off of capacitors C1 and C2 using wordlines XE or XO to generate a mid-level reference voltage. This reference circuit has the problem of not accurately setting the reference voltage level and the timing for bleeding the charge off of the reference node is difficult to control.

What is desired is a further refinement in the circuit and manner of operation of a bitline reference voltage circuit so that an accurate reference voltage can be achieved with minimum circuit and timing complexity.

SUMMARY OF THE INVENTION

In a first embodiment, a bitline reference voltage circuit according to the present invention includes a first transistor having a current path coupled between a first bitline and an intermediate node, and a gate for receiving a first control signal, a second transistor having a current path coupled between a second bitline and the intermediate node, and a gate for receiving a second control signal, a third transistor having current path coupled between the intermediate node and a source of constant voltage, and a gate for receiving a third control signal, and a capacitor coupled between the intermediate node and the source of constant voltage.

In a second embodiment, a bitline reference voltage circuit according to the present invention includes a first plurality of transistors having current paths respectively coupled between a first plurality of bitlines and an intermediate node, and a plurality of gates coupled together for receiving a first control signal, a second plurality of transistors having current paths respectively coupled between a second plurality of bitlines and the intermediate node, and a plurality of gates coupled together for receiving a second control signal, a third transistor having current path coupled between the intermediate node and a source of constant voltage, and a gate for receiving a third control signal, and a capacitor coupled between the intermediate node and the source of constant voltage.

In both embodiments, the size of the reference capacitor is approximately one-half the size of a memory cell capacitor in the memory array.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
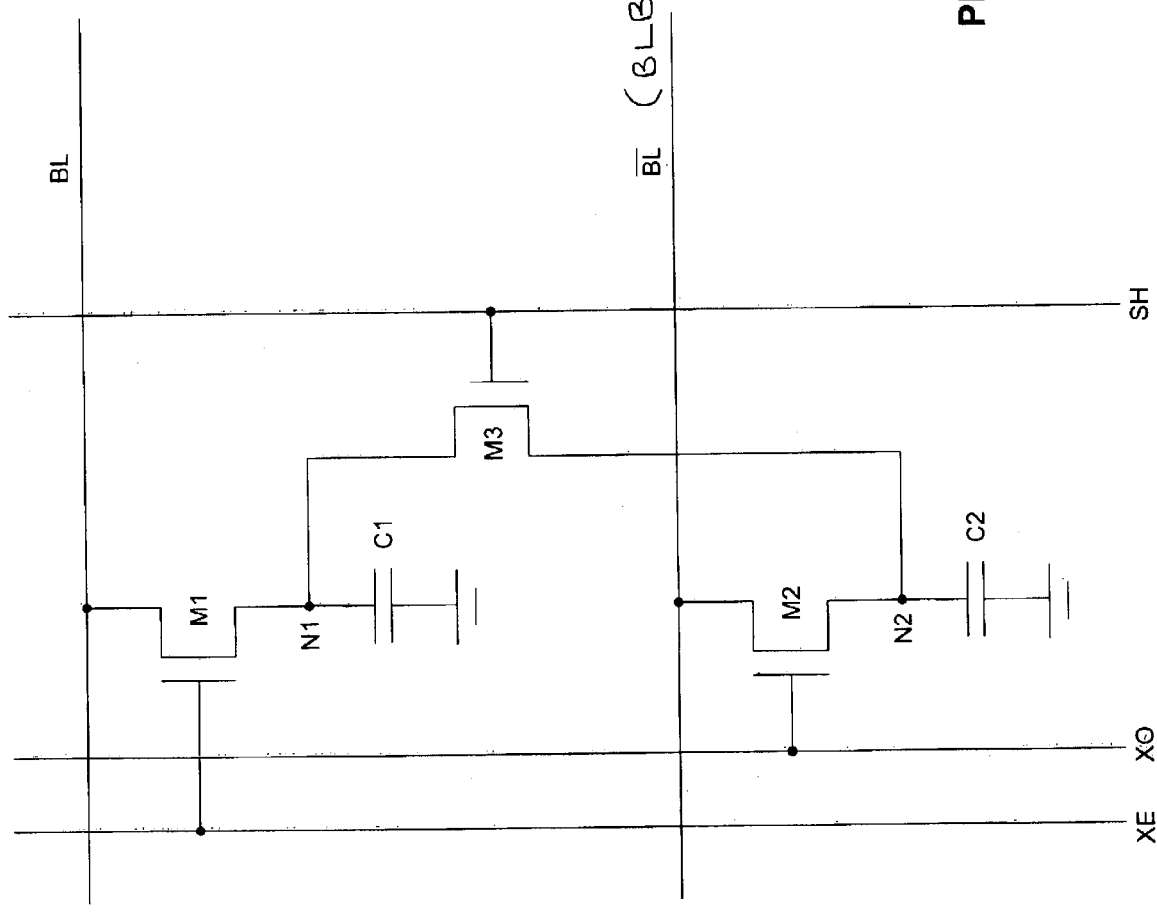
FIG. 1 is a schematic diagram of a prior art bitline reference voltage circuit.
Figure 2:
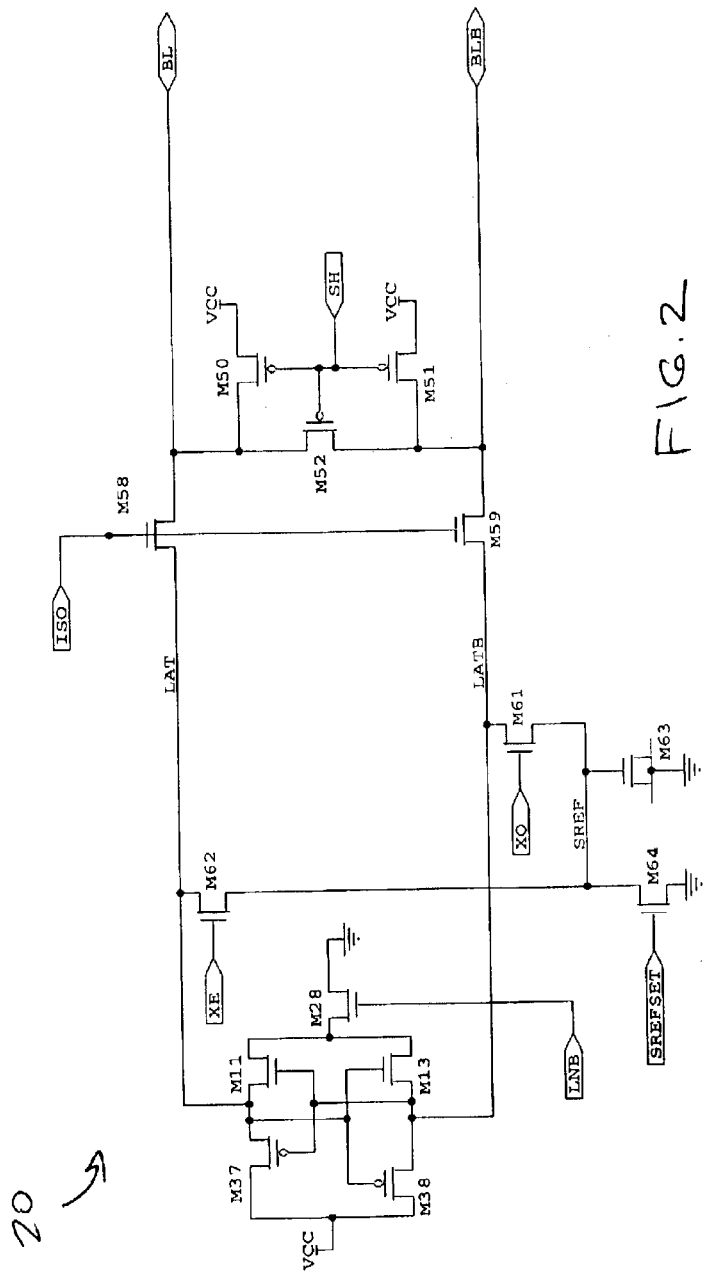
FIG. 2 is a schematic diagram of a bitline reference voltage circuit according to the present invention.

A bitline reference voltage circuit 20 according to the present invention is shown in FIG. 2. Reference circuit 20 includes a first transistor M62 having a current path coupled between a first bitline BL and an intermediate SREF node, and a gate for receiving a first control signal XE. Reference circuit 20 also includes a second transistor M61 having a current path coupled between a second bitline BLB and the intermediate SREF node, and a gate for receiving a second control signal XO. Reference circuit 20 also includes a third transistor M64 having a current path coupled between the intermediate SREF node and a source of constant voltage (ground), and a gate for receiving a third control signal designated SREFSET. A capacitor M63 is coupled between the intermediate node and the source of constant voltage (ground).

In a preferred embodiment of reference circuit 20, transistors M61, M62, and M64 are N-channel transistors. Capacitor M63 is a capacitor-connected N-channel transistor having a capacitance approximately half that of a corresponding memory cell capacitor.

P-channel transistors M50, M51, and M52 in circuit 20 pre-charge the Bl and BLB bitlines upon the command of the SH control signal. N-channel transistors M58 and M59 are used to connect and isolate the reference circuit from the bitlines under command of the ISO control signal. Finally, a sense amplifier includes cross-coupled P-channel transistors M37 and M38, as well as cross-coupled N-channel transistors M11 and M13. N-channel transistor M28 is used to activate the sense amplifier under command of the LNB control signal. This sense amplifier is designed for VCC precharged bitlines but can also be used with VSS precharged bitlines as is described in further detail below.

In operation, a mid-level voltage is created using reference circuit 20 for resolving valid logic one and zero voltages on bitlines BL and BLB.

In a first step, control signal SREFSET is initially high and then goes low to pre-charge node SREF to ground.

In a second step, the ISO control signal is turned on to connect lines LAT and LATB to bitlines Bl and BLB to allow signal to develop. At the same time a regular word line WL goes high, lines XO or XE are selected to short the SREF node to the latch node (LAT, LATB) opposite to the side of the memory cell bitline connection.

In a third step, the LNB signal is taken high to sense and latch the data on the bitlines, and to restore this data back into the memory cell.

Figure 7:
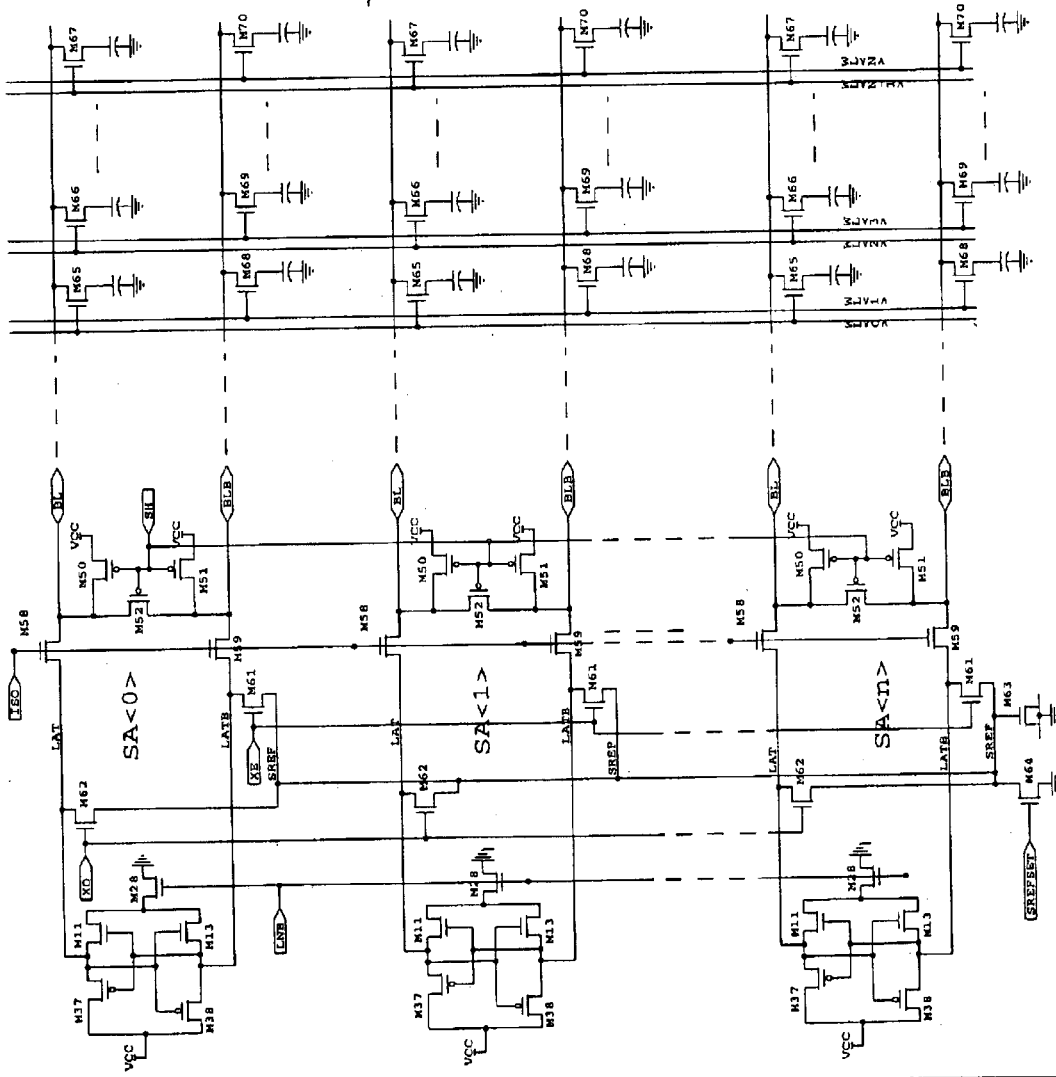
FIG. 7 is a schematic diagram of a second embodiment of the bitline reference voltage circuit according to the present invention having a first and second plurality of transistors for coupling to a plurality of first and second bitlines as shown.
Figure 6:
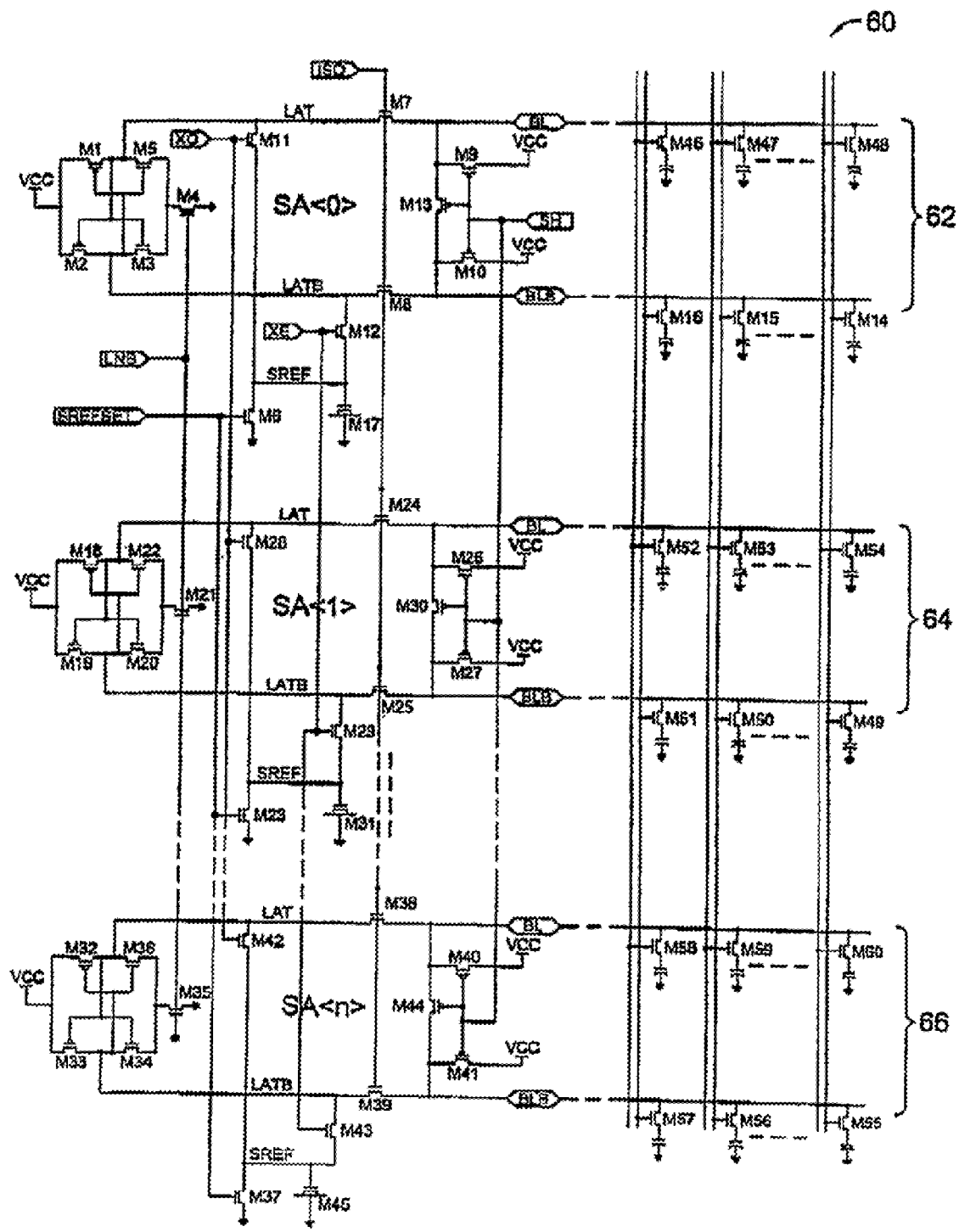
FIG. 6 shows a plurality of reference voltage circuits as shown in FIGS. 2–4 coupled to a plurality of bitlines in a memory array.
Figure 7:
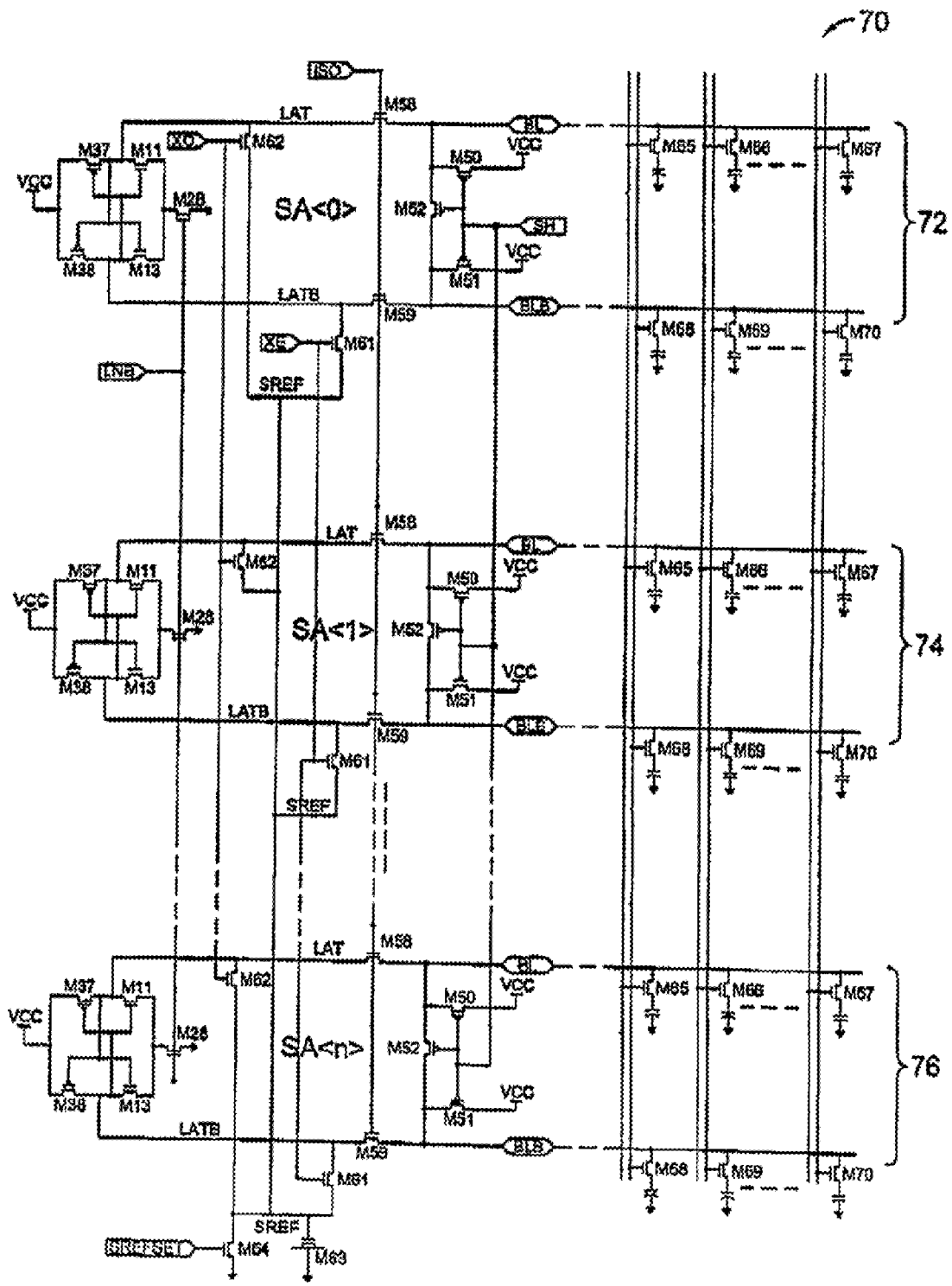
Figure 8:
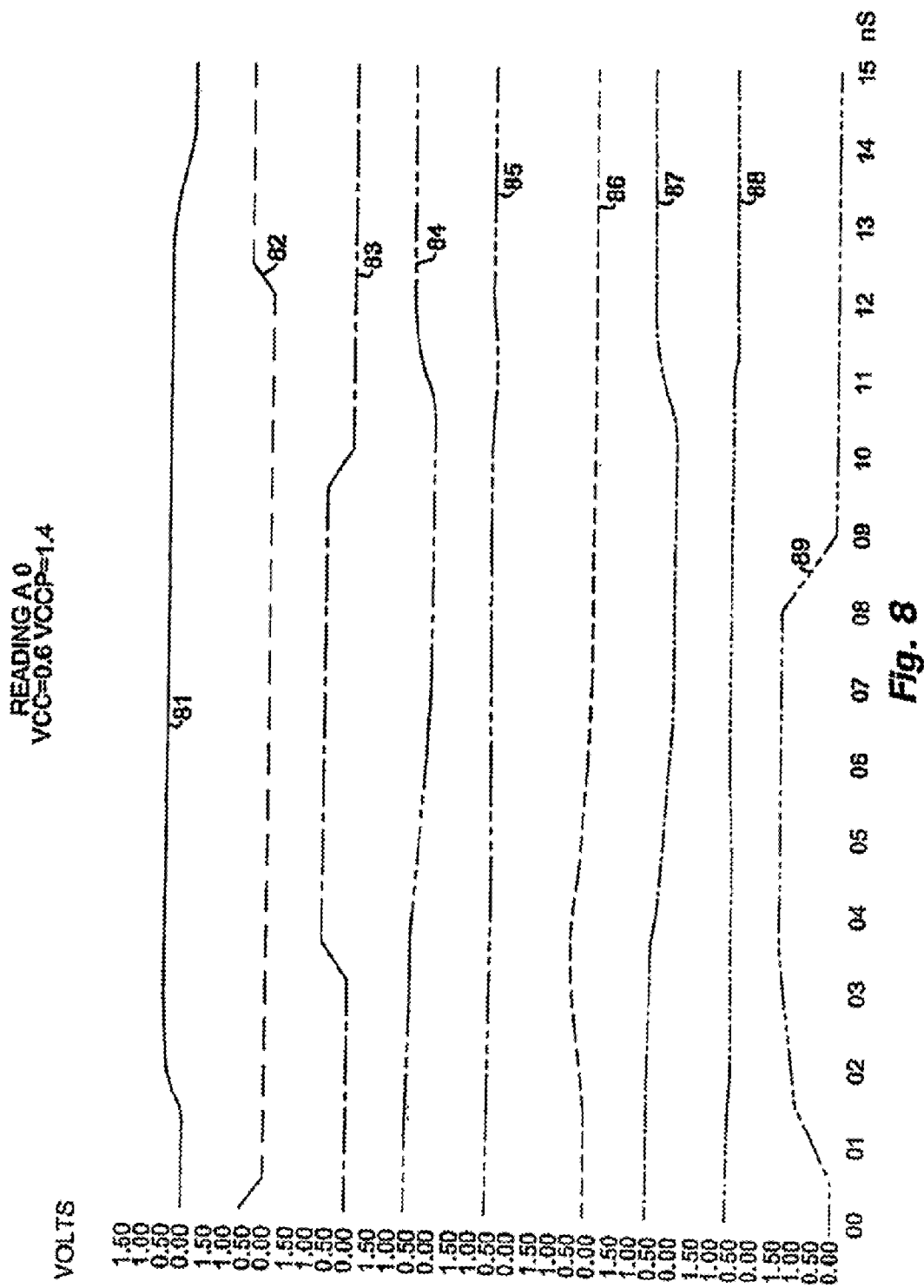
Figure 9:
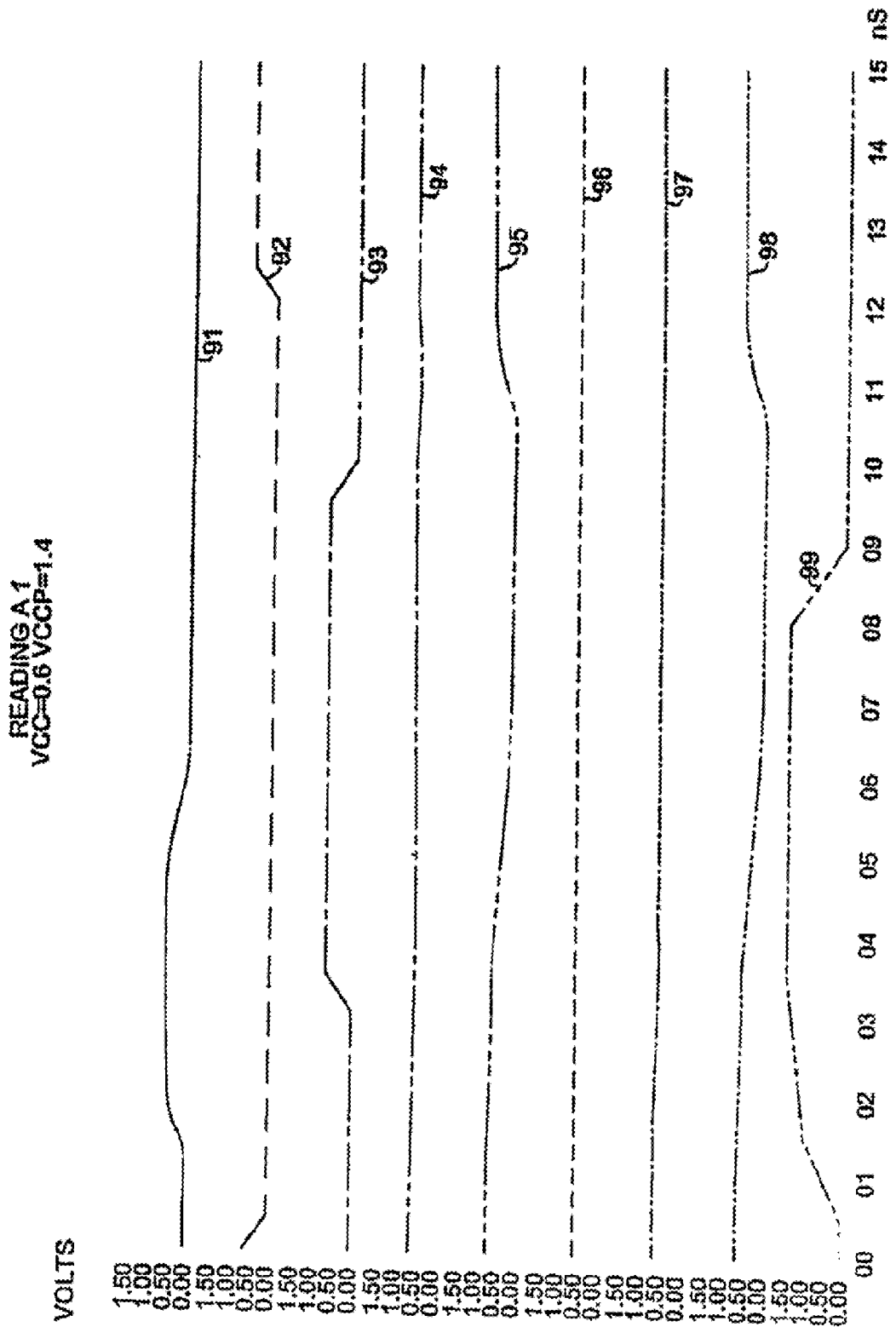

Small transistors can be used for transistors M64 and M63 and can be placed in each sense amplifier as is shown in circuit 60 of FIG. 6. Alternatively, the SREF node can run up to an entire column of sense amplifiers with one large M64 transistor and one large M63 transistor for the entire sense amp column as is shown in circuit 70 of FIG. 7. However, note that in both FIGS. 6 and 7, the transistors corresponding to transistors M61 and M62 are included for each sense amplifier and are connected to each respective BLB and BL bitline pair.

Figure 3:
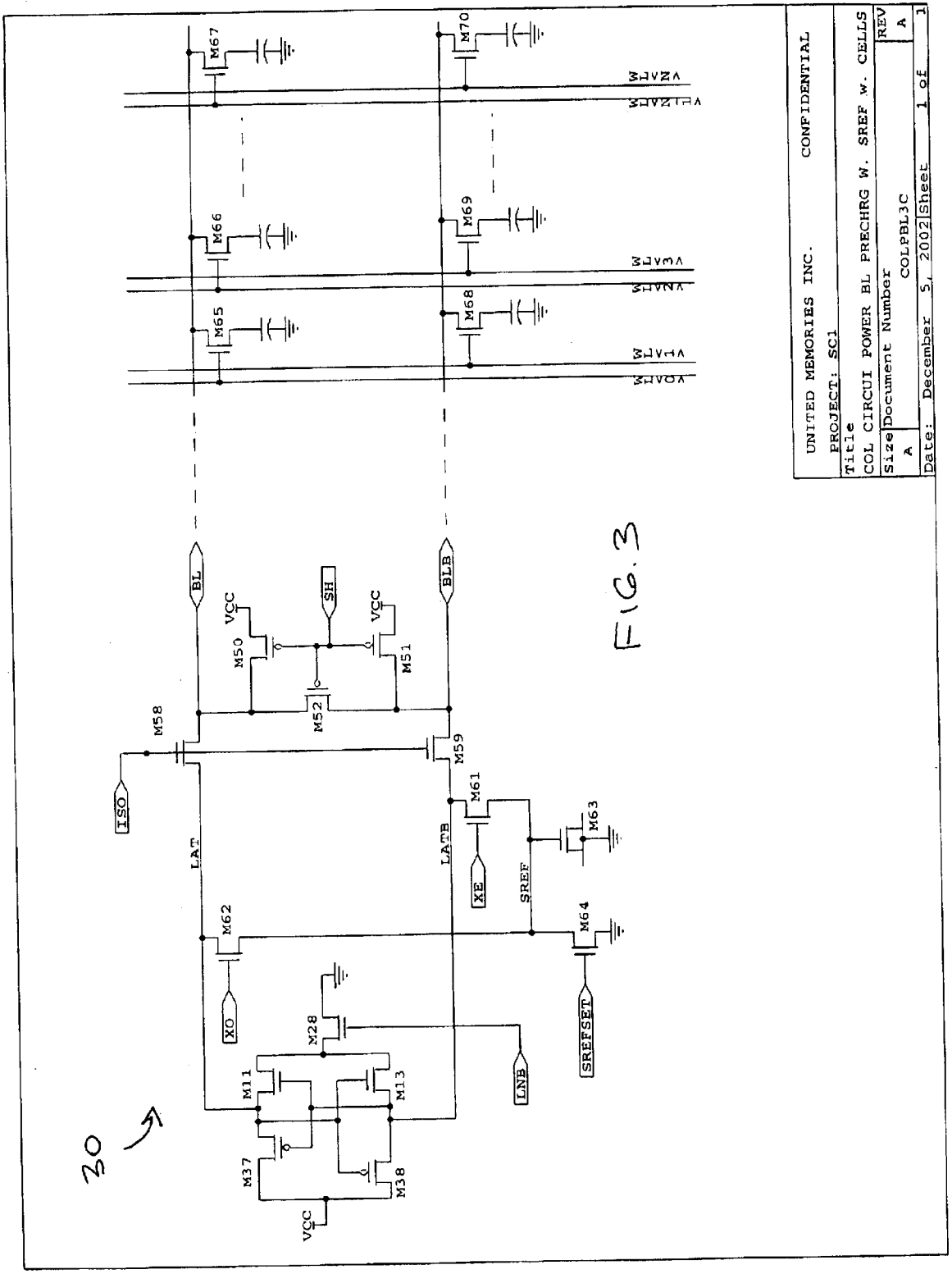
FIG. 3 is a schematic diagram of a bitline reference voltage circuit according to the present invention and including a portion of a memory array.
Figure 4:
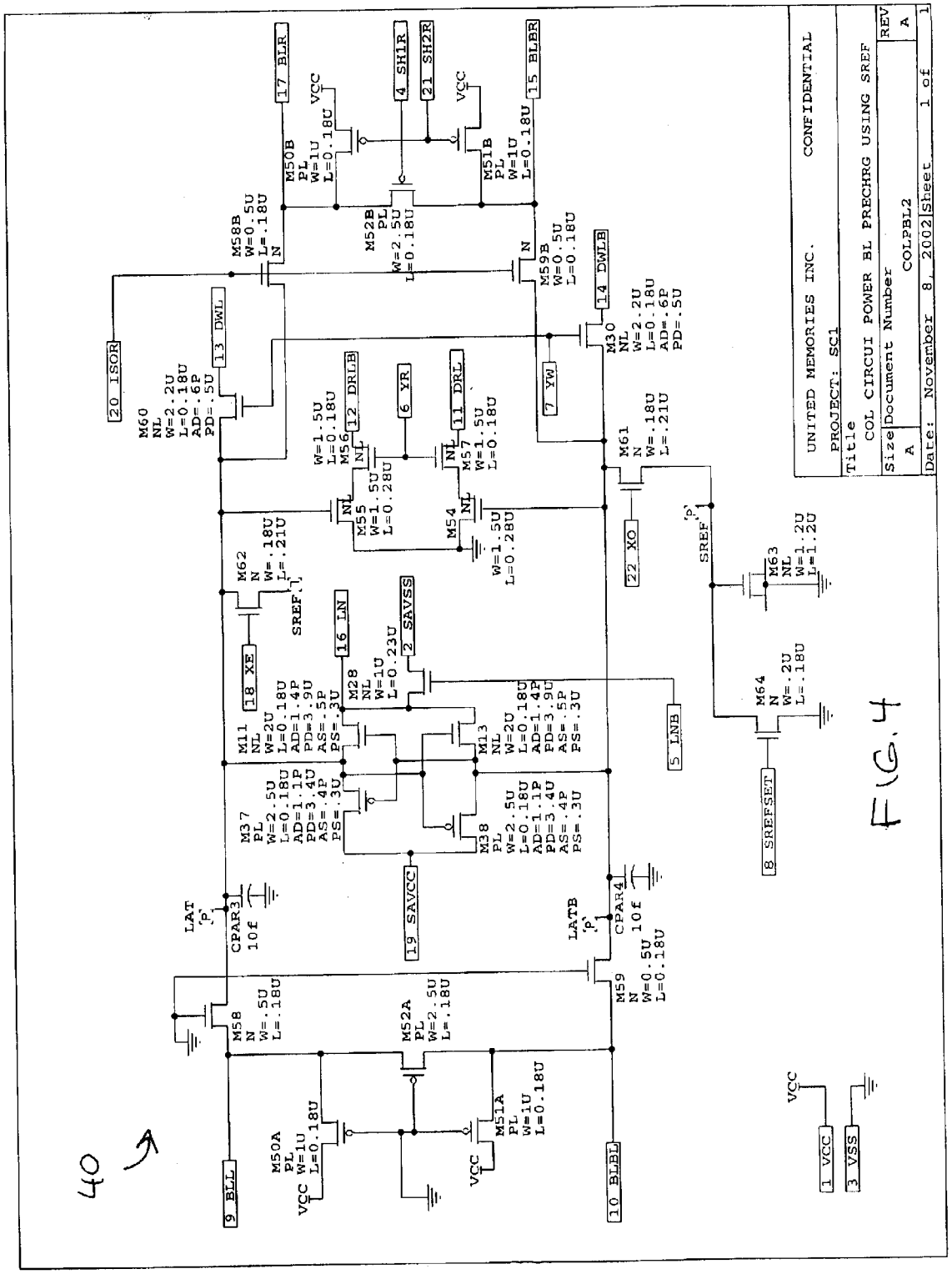
FIG. 4 is a more detailed schematic diagram of a bitline reference voltage circuit according to the present invention.
Figure 5:
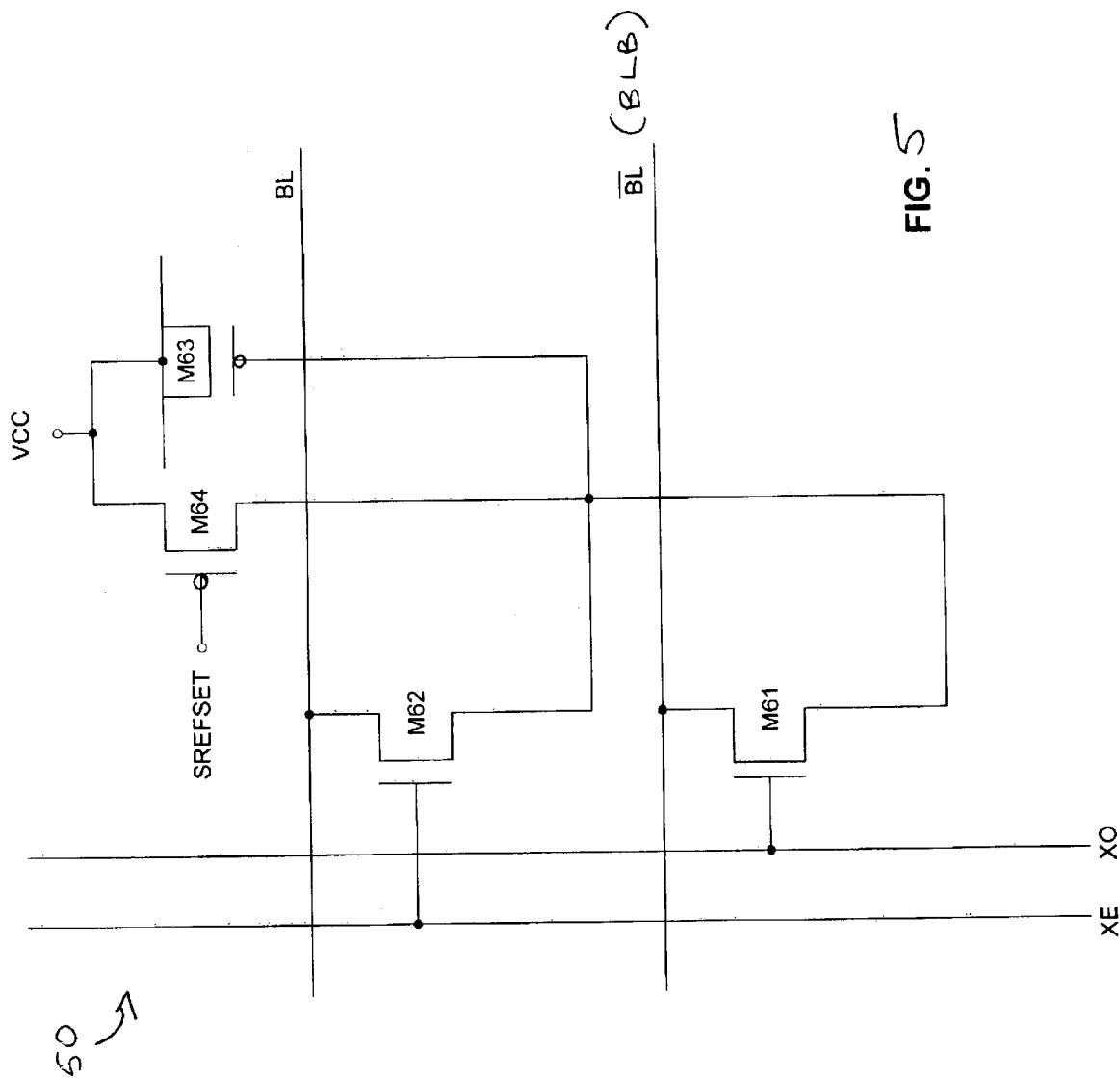
FIG. 5 is a schematic diagram of a bitline reference voltage circuit as shown in FIGS. 2–4 but modified for use with VSS precharged bit lines.

The size of capacitor-connected transistor M63 can be adjusted smaller or larger to add margin to ones or zeros sensing. The nominal size of transistor M63 corresponds to a capacitance of half that of a normal memory cell capacitor. The configuration shown in FIGS. 2–4 is for VCC precharged bit lines. For VSS precharged bit lines M63 and M64 can be P-channel transistors tied to VCC as is shown in FIG. 5. Metal options, fuse options, or programmable logic options can be used to adjust the size of capacitor-connected transistor M63 as desired.

Referring now to FIG. 4, a more detailed voltage reference circuit 40 is shown wherein the core reference voltage generator is shared between a left pair of bit lines BLL and BLBL and a right pair of bit lines BLR and BLBR. The implementation of the invention shown in FIG. 4 includes transistors M54, M55, M56 and M57 configured together with local data read lines DRL and DRLB, as well as Y-select read signal YR to perform a preamplification and column select function. Transistors M30 and M60, Y-select write signal YW, as well as local data writes lines DWL and DWLB form a column select port for writing data to the sense amplifier and on to the selected memory cell.

Figure 8:
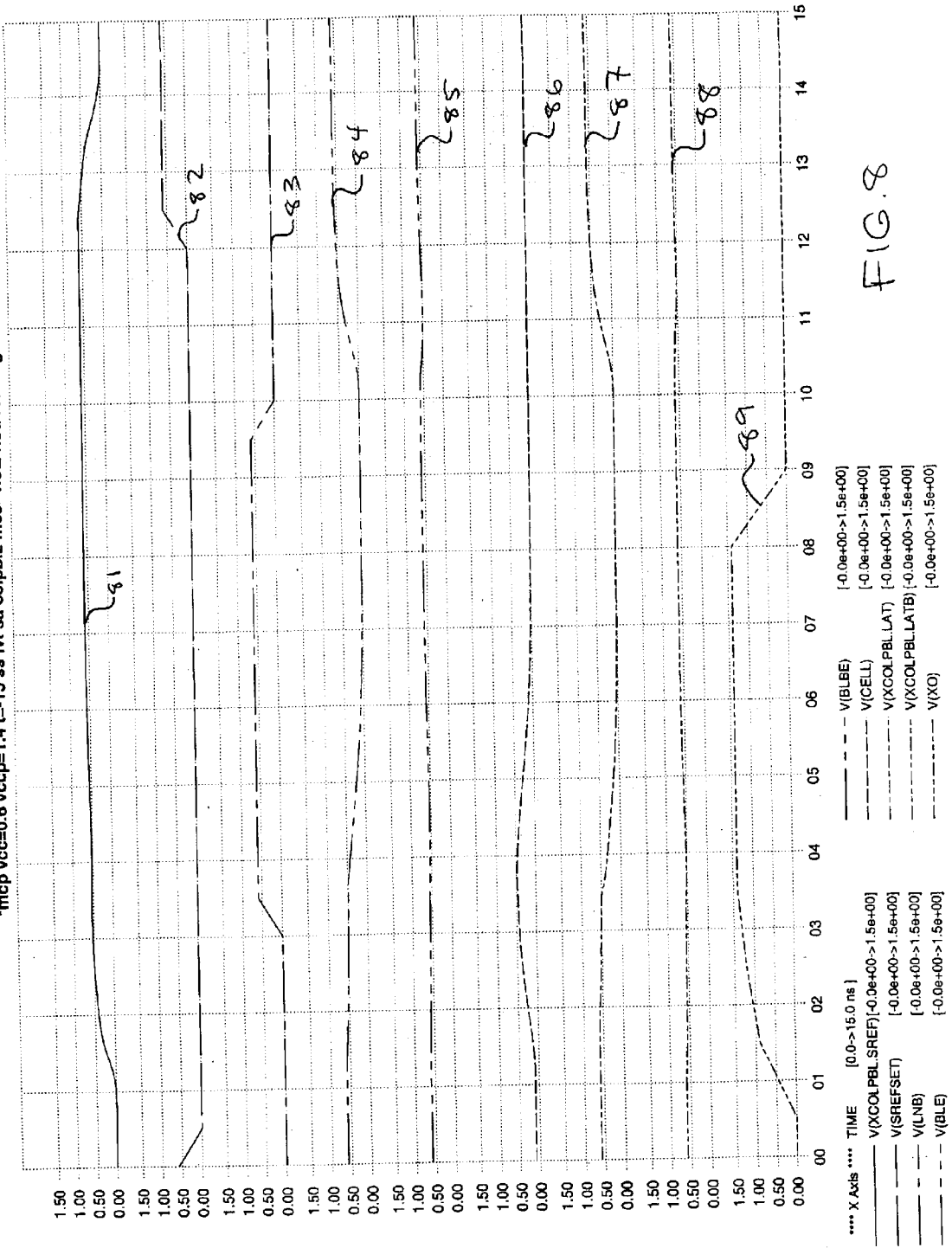
FIG. 8 is a timing diagram showing a number of signals within the reference circuit and memory array when reading a logic zero in a memory cell.

Referring now to FIG. 8, a timing diagram for the following signals is shown: SREF 81, SREFSET 82, LNB 83, BLE 84, BLBE 85, CELL 86, LAT 87, LAT 88, and XO 89. All of the signals correspond to previously discussed and designated signal names except for CELL which refers to the voltage on a memory cell capacitor. In FIG. 8, the timing for reading a data zero out of a memory cell is shown.

Figure 9:
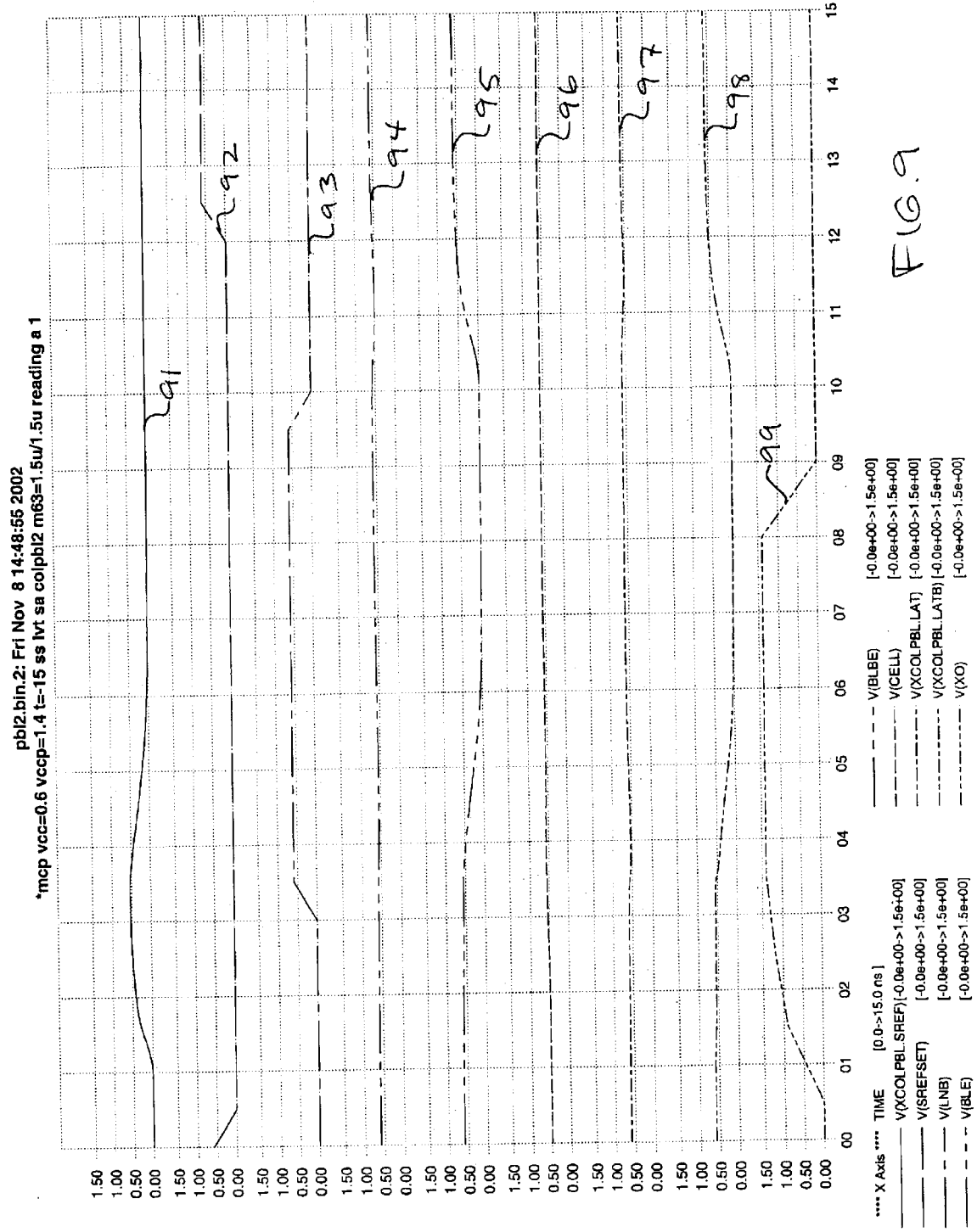
FIG. 9 is a timing diagram showing the same signals as in FIG. 8 within the reference circuit and memory array when reading a logic one in a memory cell.
Figure 1:
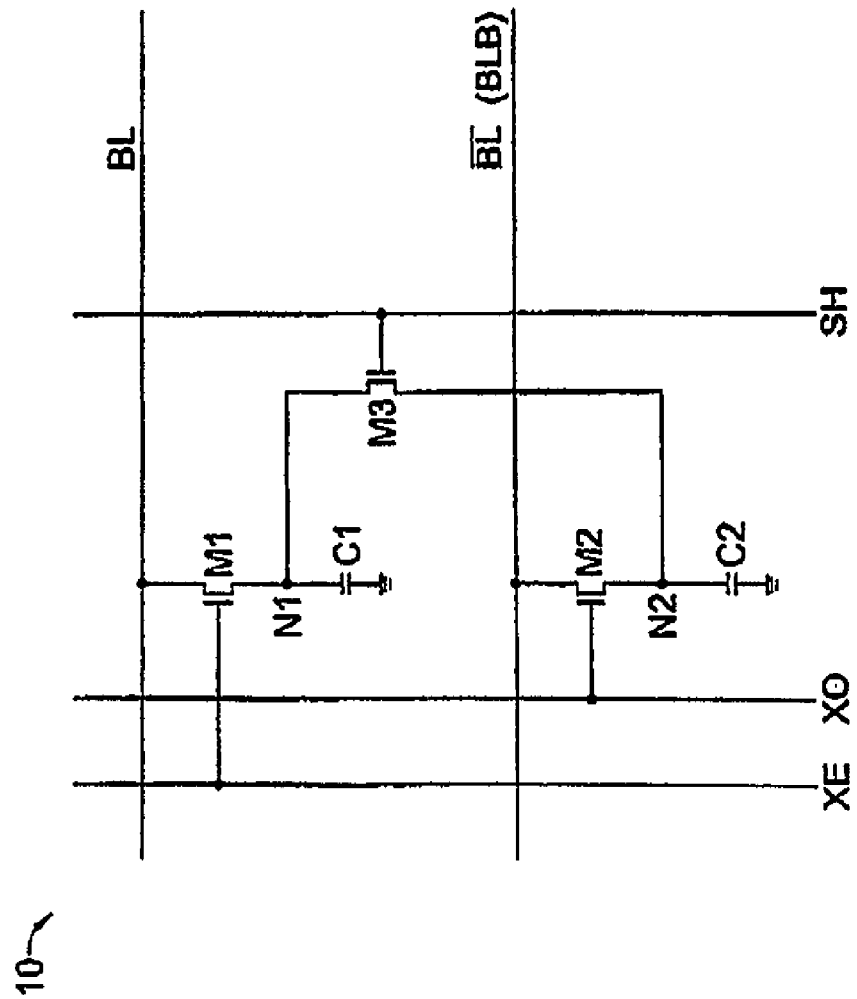
Figure 2:
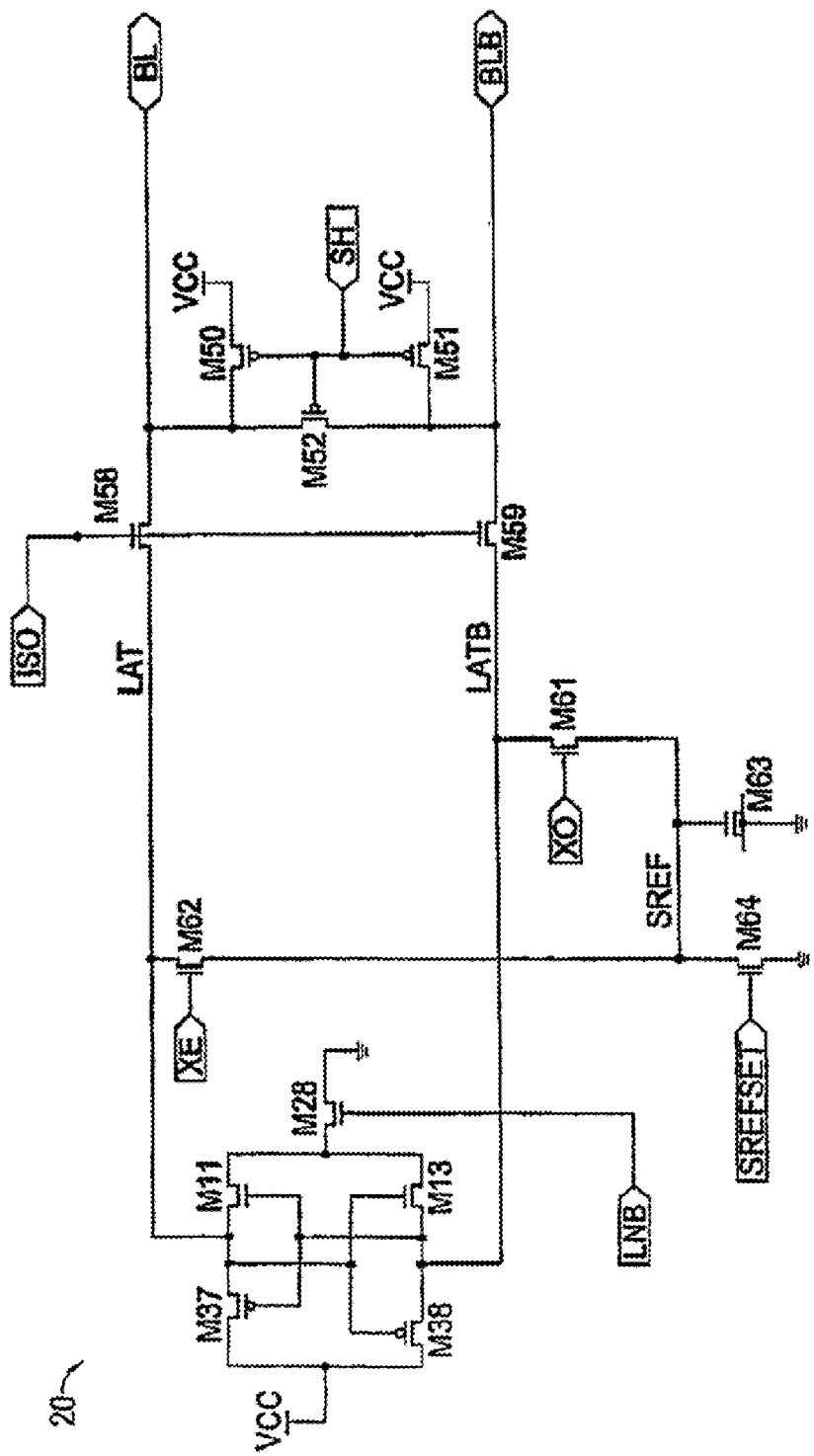
Figure 3:
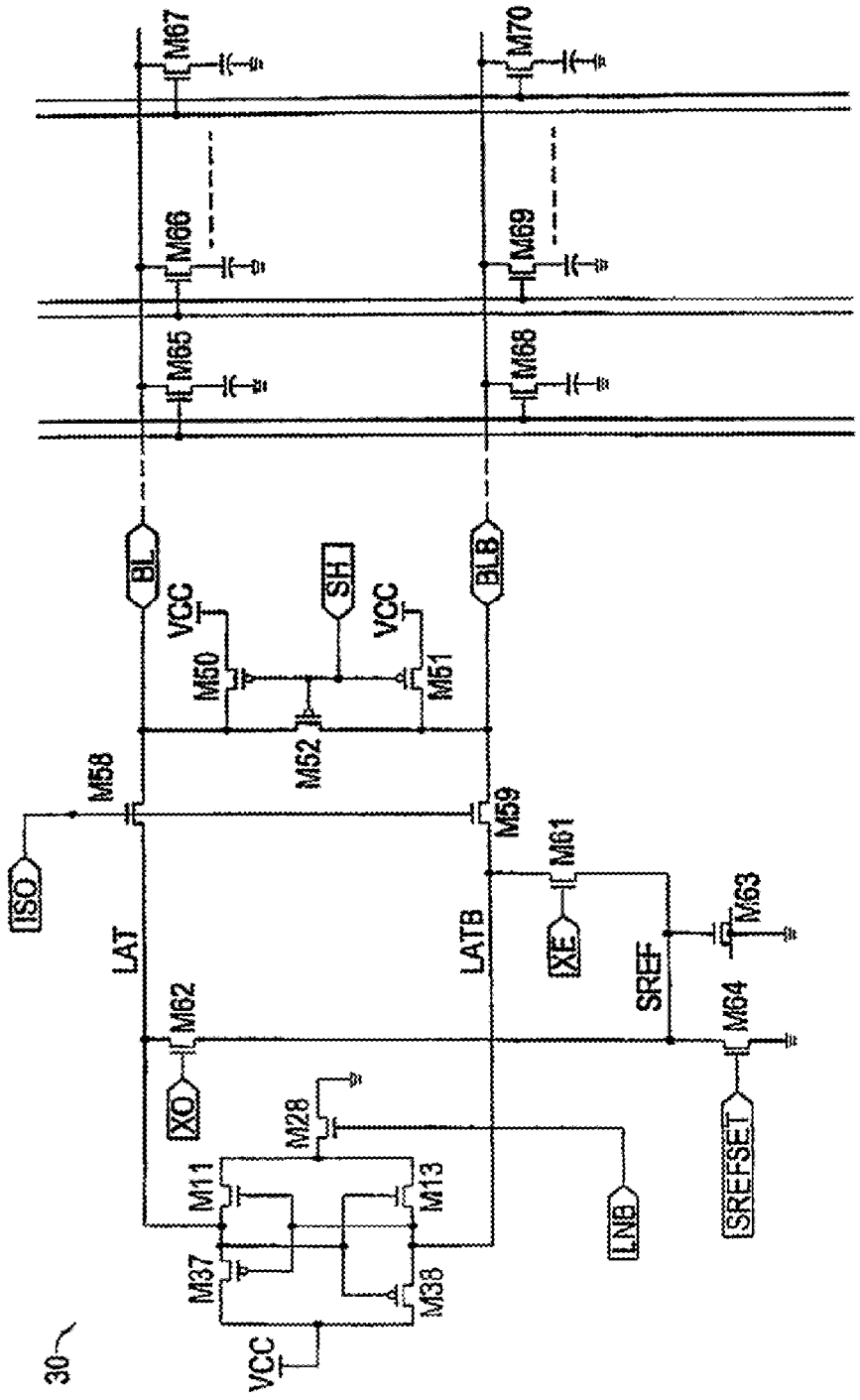
Figure 4:
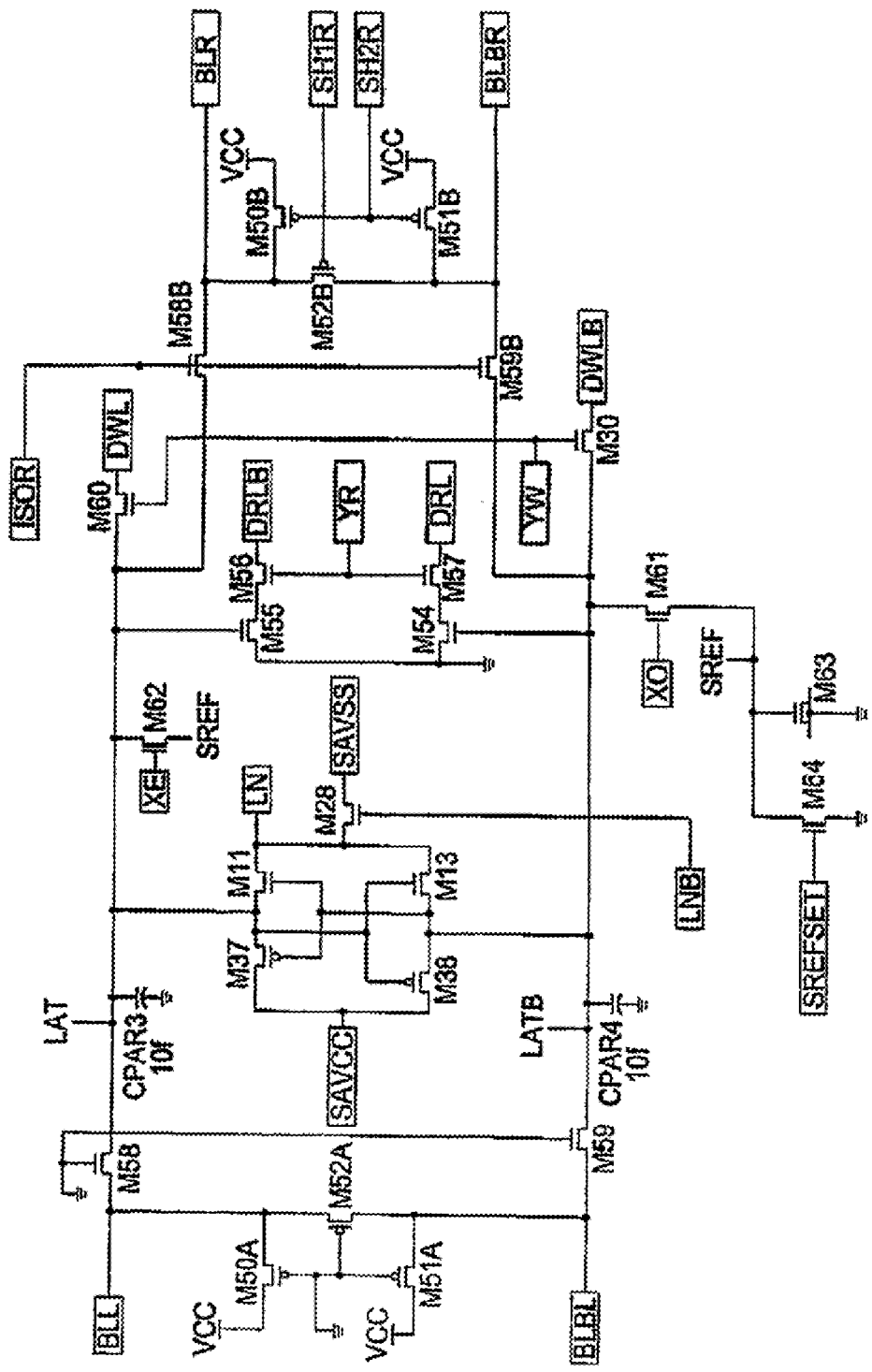
Figure 5:
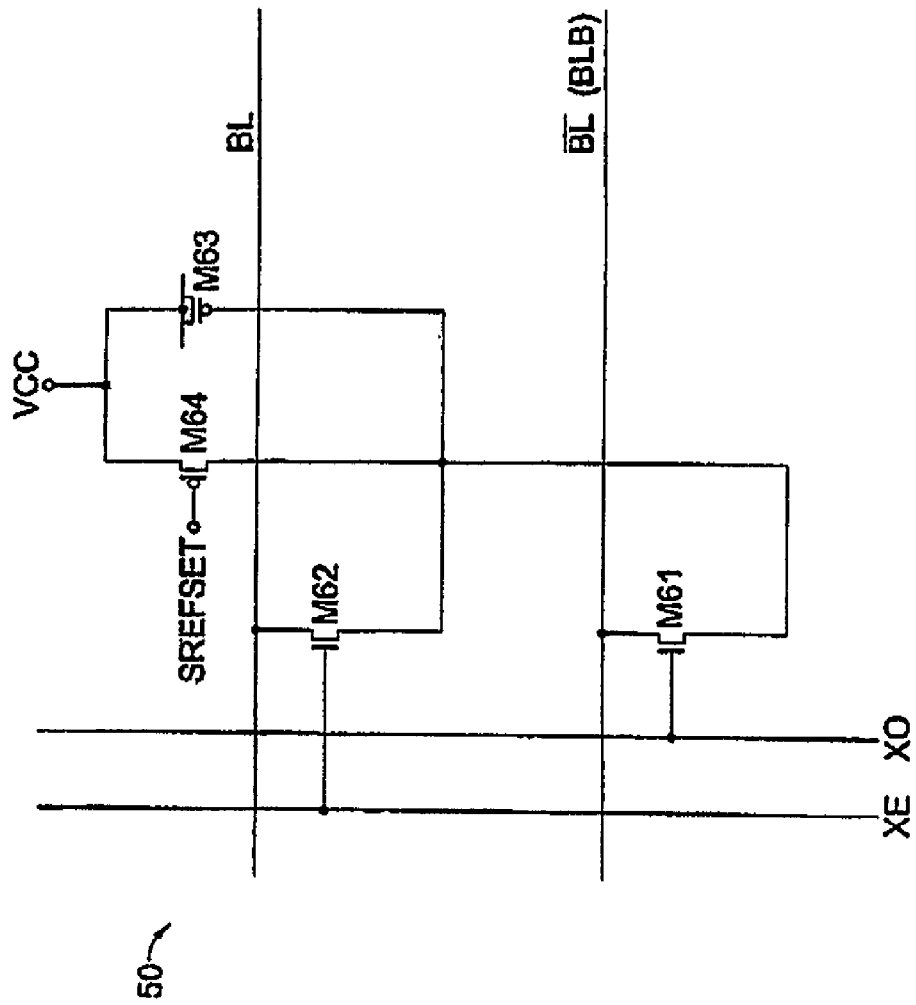

Referring now to FIG. 9, a timing diagram for the following signals is shown: SREF 91, SREFSET 92, LNB 93, BLE 94, BLBE 95, CELL 96, LAT 97, LAT 98, and XO 99. All of the signals correspond to previously discussed and designated signal names except for CELL which refers to the voltage on a memory cell capacitor. In FIG. 9, the timing for reading a data one out of a memory cell is shown.

Referring briefly again to FIGS. 2, 3, and 4 it is important to note that the reference circuit is coupled to the bitlines BL and BLB via transistors M58 and M59, which selectively couple the reference circuit via the ISO control signal. In this way the latch nodes LAT and LATB. and the reference circuit are selectively coupled to the bitlines BL and BLB. Similarly, in FIGS. 6 and 7 please note that the reference circuits or reference circuit portions are selectively coupled from the latch nodes LAT and LATB to the bitlines BL and BLB via a column of isolation transistors that receive a single ISO control signal. If desired for a particular application, however, the reference circuits or reference circuit components can be coupled directly to the bitlines without any intervening isolation circuitry.

Referring now to FIG. 3, note that a portion of a memory array including transistors M65-M70 is coupled to bitlines BL and BLB. Similarly, FIG. 6 includes memory array portions 62, 64, and 66 each respectively coupled to a bitline pair including bitlines BL and BLB. Finally, FIG. 7 includes memory array portions 72, 74, and 76 each respectively coupled to a bitline pair including bitlines BL and BLB.

While there have been described above the principles of the present invention in conjunction with a specific circuit and timing implementation it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

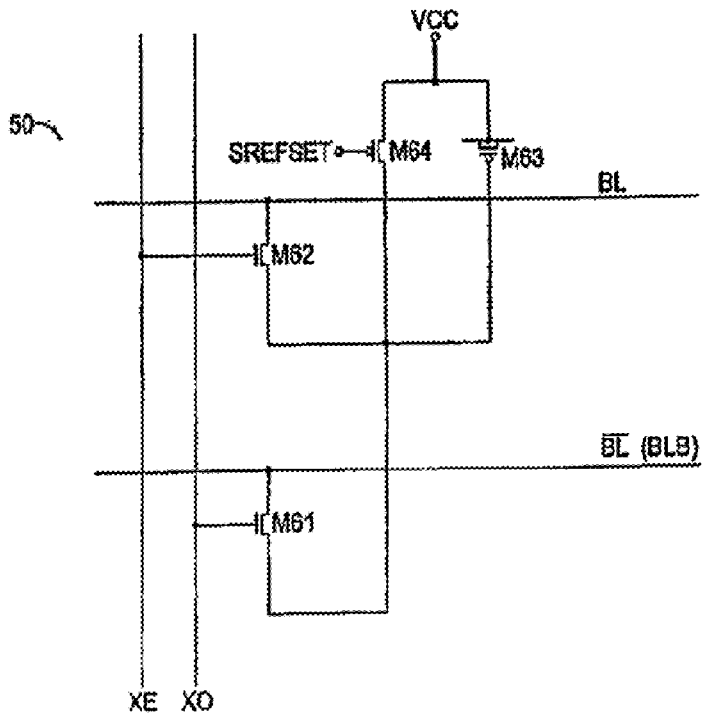

What is claimed is:

1. A bitline reference voltage circuit for an integrated circuit memory comprising:

a first transistor having a current path coupled between a first bitline and an intermediate node, and a gate for receiving a first control signal;

a second transistor having a current path coupled between a second bitline and the intermediate node, and a gate for receiving a second control signal;

a third transistor having current path coupled between the intermediate node and a source of constant voltage, and a gate for receiving a third control signal; and a capacitor coupled between the intermediate node and the source of constant voltage.

2. A bitline reference voltage circuit as in claim 1 in which the first and second transistors comprise N-channel transistors.

3. A bitline reference voltage circuit as in claim 1 in which the third transistor comprises an N-channel transistor.

4. A bitline reference voltage circuit as in claim 1 in which the third transistor comprises a P-channel transistor.

5. A bitline reference voltage circuit as in claim 1 in which the capacitor comprises a capacitor-connected N-channel transistor.

6. A bitline reference voltage circuit as in claim 1 in which the capacitor comprises a capacitor-connected P-channel transistor.

7. A bitline reference voltage circuit as in claim 1 in which the first and second control signals alternately control the first and second transistors.

8. A bitline reference voltage circuit as in claim 1 in which the source of constant voltage is ground.

9. A bitline reference voltage circuit as in claim 1 in which the source of constant voltage is a VCC power supply.

10. A bitline reference voltage circuit as in claim 1 in which the capacitor comprises a capacitor having a value approximately one-half that of a memory cell capacitor.

11. A bitline reference voltage circuit for an integrated circuit memory comprising:

a first plurality of transistors having current paths respectively coupled between a first plurality of bitlines and an intermediate node, and a plurality of gates coupled together for receiving a first control signal;

a second plurality of transistors having current paths respectively coupled between a second plurality of bitlines and the intermediate node, and a plurality of gates coupled together for receiving a second control signal;

a third transistor having current path coupled between the intermediate node and a source of constant voltage, and a gate for receiving a third control signal; and a capacitor coupled between the intermediate node and the source of constant voltage.

12. A bitline reference voltage circuit as in claim 11 in which the first and second plurality of transistors comprise N-channel transistors.

13. A bitline reference voltage circuit as in claim 11 in which the third transistor comprises an N-channel transistor.

14. A bitline reference voltage circuit as in claim 11 in which the third transistor comprises a P-channel transistor.

15. A bitline reference voltage circuit as in claim 11 in which the capacitor comprises a capacitor-connected N-channel transistor.

16. A bitline reference voltage circuit as in claim 11 in which the capacitor comprises a capacitor-connected P-channel transistor.

17. A bitline reference voltage circuit as in claim 11 in which the first and second control signals alternately control the first and second transistors.

18. A bitline-reference voltage circuit as in claim 11 in which the source of constant voltage is ground.

19. A bitline reference voltage circuit as in claim 11 in which the source of constant voltage is a VCC power supply.

20. A bitline reference voltage circuit as in claim 11 in which the capacitor comprises a capacitor having a value approximately one-half that of a memory cell capacitor.

* * * * *

UNITED STATES PATENT AND TRADEMARK OFFICE
CERTIFICATE OF CORRECTION

PATENT NO. : 6,788,590 B2
APPLICATION NO. : 10/345736
DATED : September 7, 2004
INVENTOR(S) : Parris et al.

It is certified that error appears in the above-identified patent and that said Letters Patent is hereby corrected as shown below:

THE TILTE PAGE, SHOWING AN ILLUSTRATIVE FIGURE, SHOULD BE DELETED AND SUBSTITUTE THEREFOR THE ATTACHED TITLE PAGE.

DELTE DRAWING SHEETS 1-9, AND SUBSTITUTE THEREFOR THE DRWAING SHEETS CONSISTIN OF FIGS 1-9 AS SHOWN ON THE ATTACHED PAGES.

Signed and Sealed this

Thirteenth Day of March, 2007

JON W. DUDAS
*Director of the United States Patent and Trademark Office*

(12) United States Patent
Parris et al.

(10) Patent No.: US 6,788,590 B2
(45) Date of Patent: Sep. 7, 2004

(54) BITLINE REFERENCE VOLTAGE CIRCUIT

(75) Inventors: Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 0 days.

(21) Appl. No.: 10/345,736

(22) Filed: Jan. 16, 2003

(65) Prior Publication Data
US 2004/0141360 A1 Jul. 22, 2004

(51) Int. Cl.[7] .................................. G11C 16/04
(52) U.S. Cl. ...................... 365/189.09; 365/149
(58) Field of Search .................. 365/189.09, 205, 365/149, 203, 72

(56) References Cited

U.S. PATENT DOCUMENTS 4,669,065 A 5/1987 Ohsawa
6,002,617 A * 12/1999 Manning .......... 365/189.09
6,111,803 A 8/2000 Demer et al.

* cited by examiner

Primary Examiner—David Lam
(74) Attorney, Agent, or Firm—Peter J. Meza; William J. Kubida; Hogan & Hartson LLP

(57) ABSTRACT

A bitline reference voltage circuit according to the present invention includes a first transistor having a current path coupled between a first bitline and an intermediate node, and a gate for receiving a first control signal, a second transistor having a current path coupled between a second bitline and the intermediate node, and a gate for receiving a second control signal, a third transistor having current path coupled between the intermediate node and a source of constant voltage, and a gate for receiving a third control signal, and a capacitor coupled between the intermediate node and the source of constant voltage.

20 Claims, 9 Drawing Sheets